United States Patent
Yang et al.

(10) Patent No.: US 10,417,358 B2
(45) Date of Patent: Sep. 17, 2019

(54) METHOD AND APPARATUS OF OBTAINING FEATURE INFORMATION OF SIMULATED AGENTS

(71) Applicant: BAIDU ONLINE NETWORK TECHNOLOGY (BEIJING) CO., LTD., Beijing (CN)

(72) Inventors: Wenli Yang, Beijing (CN); Tianlei Zhang, Beijing (CN); Yuchang Pan, Beijing (CN); Haowen Sun, Beijing (CN)

(73) Assignee: BAIDU ONLINE NETWORK TECHNOLOGY (BEIJING) CO., LTD., Beijing (CN)

( * ) Notice: Subject to any disclaimer, the term of this patent is extended or adjusted under 35 U.S.C. 154(b) by 220 days.

(21) Appl. No.: 15/276,767

(22) Filed: Sep. 26, 2016

(65) Prior Publication Data
US 2017/0371985 A1    Dec. 28, 2017

(30) Foreign Application Priority Data
Jun. 22, 2016  (CN) .......................... 2016 1 0457685

(51) Int. Cl.
*G06F 17/50* (2006.01)

(52) U.S. Cl.
CPC ................ *G06F 17/5009* (2013.01)

(58) Field of Classification Search
CPC ....... G06T 15/00; G06T 17/05; G06D 1/0088; G06D 1/0044; G06D 1/0274; B64C 39/024; B60R 25/102; G06F 3/14
See application file for complete search history.

(56) References Cited

U.S. PATENT DOCUMENTS

| | | | |
|---|---|---|---|
| 7,397,363 B2 * | 7/2008 | Joao ..................... | B60R 25/102 340/539.11 |
| 9,301,170 B2 * | 3/2016 | Rangappagowda .. | H04W 24/06 |

(Continued)

FOREIGN PATENT DOCUMENTS

| | | |
|---|---|---|
| CN | 103496368 A | 1/2014 |
| CN | 103593535 A | 2/2014 |
| CN | 104731853 A | 6/2015 |

OTHER PUBLICATIONS

From CN201610457685.1, First Office Action and Search Report, dated Feb. 17, 2017, with machine English translation from Global Dossier.

(Continued)

*Primary Examiner* — Kandasamy Thangavelu
(74) *Attorney, Agent, or Firm* — Ladas & Parry, LLP

(57) ABSTRACT

The present invention discloses a method and apparatus of obtaining feature information of a simulated agent. The method further comprises: for each agent class, respectively obtaining feature information of real agents belonging to the class and freely participating in traffic activities, the number of real agents belonging to each class being greater than one; for each agent class, extracting representative feature information from feature information of each real agent belonging to the class, and taking the extracted feature information as feature information of simulated agents belonging to this class. The solution of the present invention may be applied to improve correctness of testing results of unmanned vehicles.

13 Claims, 1 Drawing Sheet

(56) References Cited

U.S. PATENT DOCUMENTS

| | | | |
|---|---|---|---|
| 9,456,361 B1* | 9/2016 | Levy | H04W 24/02 |
| 9,545,995 B1* | 1/2017 | Chau | B64C 13/06 |
| 10,145,684 B1* | 12/2018 | Tofte | G06Q 40/08 |
| 10,289,760 B1* | 5/2019 | Oakes, III | G06F 17/5009 |
| 2008/0033684 A1* | 2/2008 | Vian | F41G 7/303 |
| | | | 702/113 |
| 2008/0147366 A1* | 6/2008 | Schutz | G06T 17/05 |
| | | | 703/8 |
| 2009/0076665 A1* | 3/2009 | Hoisington | G05D 1/0044 |
| | | | 701/2 |
| 2009/0313566 A1* | 12/2009 | Vian | G06T 15/00 |
| | | | 715/765 |
| 2011/0130913 A1* | 6/2011 | Duggan | G05D 1/0061 |
| | | | 701/23 |
| 2013/0238182 A1* | 9/2013 | Osagawa | G05D 1/0274 |
| | | | 701/26 |
| 2013/0338856 A1* | 12/2013 | Yelland | G05D 1/0088 |
| | | | 701/2 |
| 2016/0091894 A1* | 3/2016 | Zhang | B64C 39/024 |
| | | | 701/2 |
| 2016/0150427 A1* | 5/2016 | Ramanath | H04W 24/06 |
| | | | 370/252 |
| 2017/0010611 A1* | 1/2017 | Tao | G06F 3/14 |

OTHER PUBLICATIONS

From CN201610457685.1, Second Office Action, dated Jun. 1, 2016, with machine English translation from Global Dossier.
From CN201610457685.1, Decision of Rejection, dated Sep. 29, 2017, with machine English translation from Google Translate.

* cited by examiner

METHOD AND APPARATUS OF OBTAINING FEATURE INFORMATION OF SIMULATED AGENTS

CROSS-REFERENCE TO RELATED APPLICATION

This application claims the priority to and the benefit of Chinese Patent Application No. CN201610457685.1 filed on Jun. 22, 2016, the disclosure of which is incorporated herein by reference in its entirety.

FIELD OF THE INVENTION

The present invention relates to network technologies, and particularly to a method and apparatus for obtaining feature information of a simulated agent.

BACKGROUND OF THE INVENTION

During research and development of unmanned vehicles, a lot of real scenarios are needed to test correctness of algorithm.

However, it will be very dangerous and less efficient if all tests are performed in real traffic scenarios. Hence, it is necessary to use simulated traffic scenarios in place of real traffic scenarios to complete a lot of preliminary tests.

In a complicated traffic scenario, there are diverse agents which move freely by certain rules in the complicated traffic scenario.

The agents refer to entities that have an initiative moving capability, and may comprise pedestrians, bicycles, vehicles, cars and the like.

Correspondingly, upon simulating the traffic scenario, it is necessary to simulate a scenario map as well as various agents that might occur in the scenario.

In the prior art, the agents are mainly simulated in the following manners:

Feature information of a series of different agents is pre-defined manually, and simulated agents conforming to the feature information are generated according to manually-selected feature information.

However, this manner has substantial limitation. For example, manually-defined feature information might not comply with real traffic scenario or lacks certain feature information, and thereby affects correctness of subsequent test results of unmanned vehicles.

SUMMARY OF THE INVENTION

The present invention provides a method and apparatus for obtaining feature information of a simulated agent, which can improve correctness of test results of unmanned vehicles.

Specific technical solutions are as follows:

A method of obtaining feature information of a simulated agent comprises:

for each agent class, respectively obtaining feature information of real agents belonging to the class and freely participating in traffic activities, the number of real agents belonging to each class being greater than one;

for each agent class, respectively extracting representative feature information from feature information of each real agent belonging to the class, and taking the extracted feature information as feature information of simulated agents belonging to this class.

According to a preferred embodiment of the present invention, the real agents comprise real agents dedicated for testing;

The feature information comprises attribute information and behavior information.

According to a preferred embodiment of the present invention, the obtaining behavior information of each real agent respectively comprises:

during an activity of each real agent, obtaining dynamic tracking information of the real agent in real time;

after the activity of each real agent ends up, determining behavior information of the real agent by performing analysis of dynamic tracking information of the real agent.

According to a preferred embodiment of the present invention, the behavior information comprises action behaviors occurring during the activity and trigger conditions of various action behaviors.

According to a preferred embodiment of the present invention, the attribute information comprises a class, length, width, height.

According to a preferred embodiment of the present invention, the method further comprises:

performing playback of the simulated agent according to the user-selected feature information;

during playback, if the user's modification instruction for unreasonable feature information is received, modifying the information according to the modification instruction.

An apparatus for obtaining feature information of a simulated agent, comprising an obtaining unit and an extracting unit;

the obtaining unit is configured to, for each agent class, respectively obtain feature information of real agents belonging to the class and freely participating in traffic activities, the number of real agents belonging to each class being greater than one, and transmit feature information of each real agent to the extracting unit;

the extracting unit is configured to, for each agent class, respectively extract representative feature information from feature information of each real agent belonging to the class, and take the extracted feature information as feature information of simulated agents belonging to this class.

According to a preferred embodiment of the present invention, the real agents comprise real agents dedicated for testing;

The feature information comprises attribute information and behavior information.

According to a preferred embodiment of the present invention, after an activity of each real agent ends up, the obtaining unit determines behavior information of the real agent by performing analysis of the obtained dynamic tracking information of the real agent during the activity.

According to a preferred embodiment of the present invention, the behavior information comprises action behaviors occurring during the activity and trigger conditions of various action behaviors.

According to a preferred embodiment of the present invention, the attribute information comprises a class, length, width, height.

The apparatus further comprises a playback unit;

The extracting unit is further configured to transmit the obtained feature information of the simulated agent to the playback unit;

The playback unit is configured to play back the simulated agent according to the user-selected feature information, and during playback, if the user's modification instruction for unreasonable feature information is received, modify the information according to the modification instruction.

As can be seen from the above introduction, the solution of the present invention may be used to obtain feature information of various real agents which really participate in traffic activities, and consider feature information of the real agents as feature information of virtual agents in corresponding classes, thereby remedying drawbacks in the prior art and thereby improving correctness of subsequent testing results of the unmanned vehicles.

DETAILED DESCRIPTION OF PREFERRED EMBODIMENTS

In view of problems existing in the prior art, the present invention provides a solution of obtaining feature information of simulated agents, which can improve correctness of subsequent test results of unmanned vehicles.

The solution of the present invention will be described in detail in conjunction with figures and embodiments to make technical solutions of the present invention clearer.

Embodiment 1

Figure 1:
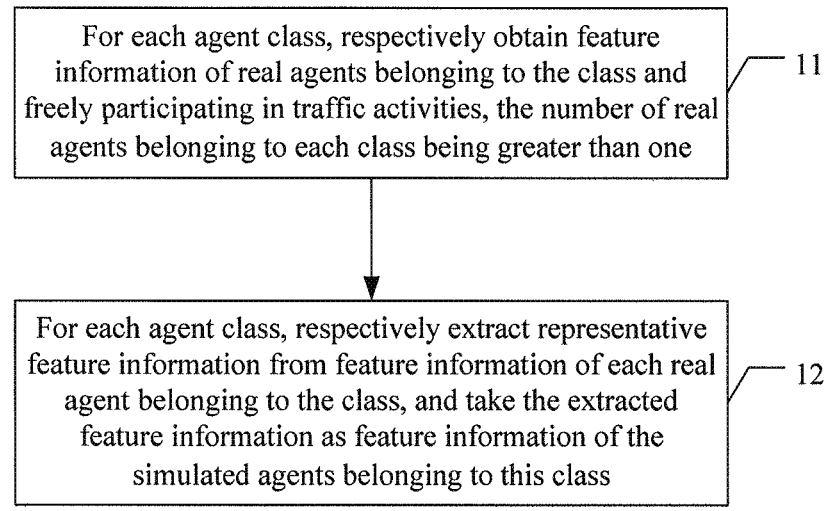
FIG. 1 is a flow chart of an embodiment of a method of obtaining feature information of simulated agents according to the present invention.

FIG. 1 is a flow chart of an embodiment of a method of obtaining feature information of simulated agents according to the present invention. As shown in FIG. 1, the embodiment comprises the following specific implementation mode.

In step 11, for each agent class, respectively obtaining feature information of real agents belonging to the class and freely participating in traffic activities, the number of real agents belonging to each class being greater than one.

The agent classes may comprise pedestrian, bicycle, car, bus and the like, the vehicle mentioned here mainly referring to private cars.

A plurality of real agents may be configured for each agent class for testing. Take car class as an example, a plurality of testing cars may be configured, and these testing cars are allowed to really participate in traffic activities, namely, the driver drives these testing cars to run on a real road.

The number of real agents for testing under each agent class may be determined according to actual needs. Theoretically, the larger the number of the real agents for testing is, a more accurate extraction result is obtained subsequently.

The feature information of each real agent may comprise attribute information and behavior information.

Wherein, the attribute information may comprise a class, length, width, height and the like. How to obtain the attribution information is of prior art, for example, information such as length, width and height may be obtained by a sensor such as a camera or a radar.

In addition, during movement of each real agent, dynamic tracking information of the real agent may be obtained in real time, such as location, speed, movement state and movement direction of a current Global Positioning System (GPS).

A sensor carried on (configured purposefully for) the rear agent may be used to obtain dynamic tracking information of the real agent.

After an activity of a certain real agent ends up, behavior information of the real agent is determined by analyzing dynamic tracking information of the real agent.

For example, a testing car travels two hours on the road, dynamic tracking information of this testing car within the two hours may be obtained, whereby analysis may be performed through dynamic tracking information of the testing car to determine behavior information of the testing car.

The behavior information may comprise action behaviors occurring during the activity, trigger conditions of various action behaviors, and the like.

The action behaviors occurring during the activity may comprise: acceleration, deceleration, sudden braking, sudden acceleration, accelerate threading, traversing, lane change, turning, sudden turning and the like.

The trigger conditions of action behaviors may comprise: confrontation with red and green lights, confrontation with traversing of pedestrians, and sudden occurrence of pedestrians and the like.

How to obtain the behavior information of the real agents according to the dynamic tracking information belongs to the prior art. Different classes of agents correspond to different behavior information.

In step 12, for each agent class, respectively extracting representative feature information from feature information of each real agent belonging to the class, and taking the extracted feature information as feature information of simulated agents belonging to this class.

After the feature information of each real agent in the same class is obtained, representative feature information may be extracted therefrom, namely, representative attribute information and behavior information is extracted, and the extracted feature information is considered as the feature information of the simulated agents in the class.

Take behavior information as an example. Representative behavior information may refer to feature information of personal behaviors that are relatively universal and do not belong to specific agents.

In practical application, the representative feature information may be extracted by virtue of a classification algorithm, and specific implementation thereof is of the prior art.

Then, the user may select attribute information and behavior information purposefully to perform playback of the simulated agent, that is, agent corresponding to the selected attribute information and behavior information may be simulated according to the user-selected feature information as well as the prior art.

For example, a visualization interaction interface may be displayed, the user may select the attribution information and behavior information in a specific area in the visualization interaction interface, the simulated agent may be exhibited, namely, played back, in real time in the specific area in the visualization interaction interface according to the user-selected attributed information and behavior information.

The playback function may comprise single-time playback and continuous multi-time playback.

During playback, if the user finds unreasonable feature information, he may modify the unreasonable feature information to ensure correctness of the feature information.

The simulated agent may be superimposed in the scenario map to obtain a simulated traffic scenario, and thereby related test of the unmanned vehicle is completed according to the simulated traffic scenario.

The method embodiment is introduced above. The solution of the present invention will be further described below by describing an apparatus embodiment.

Embodiment 2

Figure 2:
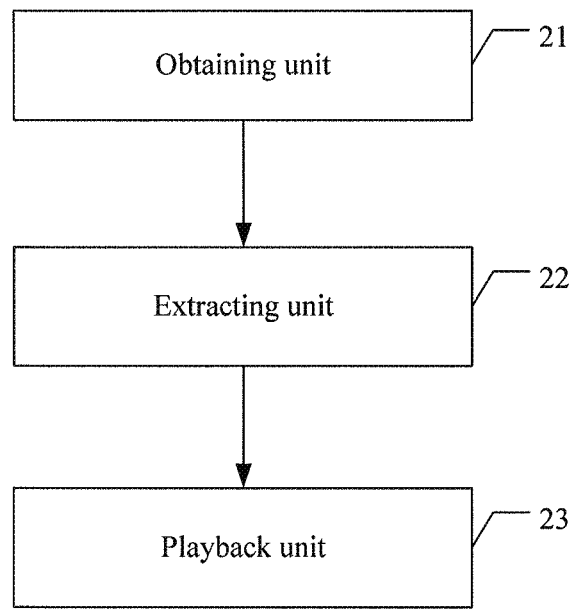
FIG. 2 is a structural schematic view showing components of an embodiment of an apparatus for obtaining feature information of simulated agents according to the present invention.

FIG. 2 is a structural schematic view showing components of an embodiment of an apparatus for obtaining feature information of simulated agents according to the present invention. As shown in FIG. 2, the apparatus comprises an obtaining unit 21 and an extracting unit 22.

The obtaining unit 21 is configured to, for each agent class, respectively obtain feature information of real agents belonging to the class and freely participating in traffic activities, the number of real agents belonging to each class being greater than one, and transmit feature information of each real agent to the extracting unit 22;

The extracting unit 22 is configured to, for each agent class, respectively extract representative feature information from feature information of each real agent belonging to the class, and take the extracted feature information as feature information of simulated agents belonging to this class.

The agent classes may comprise pedestrian, bicycle, car, bus and the like.

A plurality of real agents may be configured for each agent class for testing. Take car class as an example, a plurality of testing cars may be configured, and these testing cars are allowed to really participate in traffic activities, namely, the driver drives these testing cars to run on a real road.

The number of real agents for testing under each agent class may be determined according to actual needs. Theoretically, the larger the number of the real agents for testing is, a more accurate extraction result is obtained subsequently.

The feature information of each real agent may comprise attribute information and behavior information.

Wherein, the attribute information may comprise a class, length, width, height and the like. How to obtain the attribution information is of prior art.

In addition, during movement of each real agent, dynamic tracking information of the real agent may be obtained in real time, such as location, speed, movement state and movement direction of a current Global Positioning System (GPS).

A sensor carried on (configured purposefully for) the rear agent may be used to obtain dynamic tracking information of the real agent.

After an activity of each real agent ends up, the obtaining unit 21 may obtain the dynamic tracking information of the real agent, and perform analysis through dynamic tracking information of the real agent to determine behavior information of the real agent.

The behavior information may comprise action behaviors occurring during the activity, trigger conditions of various action behaviors, and the like.

The action behaviors occurring during the activity may comprise: acceleration, deceleration, sudden braking, sudden acceleration, accelerate threading, traversing, lane change, turning, sudden turning and the like.

The trigger conditions of action behaviors may comprise: confrontation with red and green lights, confrontation with traversing of pedestrians, and sudden occurrence of pedestrians and the like.

How to obtain the behavior information of the real agents by the obtaining unit 21 according to the dynamic tracking information belongs to the prior art. Different classes of agents correspond to different behavior information.

The obtaining unit 21 may transmit the obtained feature information of each real agent to the extracting unit 22, and correspondingly, the extracting unit 22 is configured to extract representative feature information from feature information of each real agent in the same class, namely, representative attribute information and behavior information is extracted, and the extracted feature information is considered as the feature information of the simulated agents in the class.

As shown in FIG. 2, the apparatus in the present embodiment may further comprise a playback unit 23.

Correspondingly, the extracting unit 22 may be further configured to transmit the obtained feature information of the simulated agent to the playback unit 23;

The playback unit 23 is configured to play back the simulated agent according to the user-selected feature information, and during playback, if the user's modification instruction for unreasonable feature information is received, modify the information according to the modification instruction.

That is to say, the user may select attribute information and behavior information purposefully to perform playback of the simulated agent, that is, the playback unit 23 is configured to simulate an agent corresponding to the selected attribute information and behavior information according to the user-selected feature information as well as the prior art.

For example, the playback unit 23 may display a visualization interaction interface, the user may select the attribution information and behavior information in a specific area in the visualization interaction interface, the simulated agent may be exhibited, namely, played back, in real time in the specific area in the visualization interaction interface according to the user-selected attributed information and behavior information.

During playback, if the user finds unreasonable feature information, he may modify the unreasonable feature information to ensure correctness of the feature information.

In the embodiments provided by the present invention, it should be understood that the revealed apparatus and method can be implemented through other ways. For example, the embodiments for the apparatus are only exemplary, e.g., the division of the units is merely logical one, and, in reality, they can be divided in other ways upon implementation.

The units described as separate parts may be or may not be physically separated, the parts shown as units may be or may not be physical units, i.e., they can be located in one place, or distributed in a plurality of network units. One can select some or all the units to achieve the purpose of the embodiment according to the actual needs.

Further, in the embodiments of the present invention, functional units can be integrated in one processing unit, or they can be separate physical presences; or two or more units can be integrated in one unit. The integrated unit described above can be realized in the form of hardware, or they can be realized with hardware and software functional units.

The aforementioned integrated unit in the form of software function units may be stored in a computer readable storage medium. The aforementioned software function units are stored in a storage medium, including several instructions to instruct a computer device (a personal computer, server, or network equipment, etc.) or processor to perform some steps of the method described in the various embodiments of the present invention. The aforementioned storage medium includes various media that may store program codes, such as U disk, removable hard disk, readonly memory (ROM), a random access memory (RAM), magnetic disk, or an optical disk.

The foregoing is only preferred embodiments of the present invention, not intended to limit the invention. Any modifications, equivalent replacements, improvements and the like made within the spirit and principles of the present invention, should all be included in the present invention within the scope of protection.

What is claimed is:

1. A method for testing an unmanned vehicle in a simulated traffic scenario, wherein the method comprises:
   for each agent class, respectively obtaining feature information of real agents belonging to the class and freely participating in traffic activities and in testing, the number of real agents belonging to each class being greater than one;
   simulating one or more agents of one or more classes;
   for each agent class, respectively extracting representative feature information from feature information obtained for each real agent belonging to the class, and taking the extracted representative feature information as feature information of simulated agents belonging to this class in the simulated traffic scenario, the representative information being feature information that are classified as universal among the agents;
   generating a real traffic scenario using the real agents participating in traffic activities and in testing, forming a scenario map;
   obtaining the simulated traffic scenario by superimposing the simulated agents in the scenario map; and
   testing the unmanned vehicle in the simulated traffic scenario and improving the correctness of testing the unmanned vehicle.

2. The method according to claim 1, wherein,
   the real agents comprise real agents dedicated for testing;
   the feature information comprise attribute information and behavior information.

3. The method according to claim 2, wherein,
   the obtaining behavior information of each real agent respectively comprises:
   during an activity of each real agent, obtaining dynamic tracking information of the real agent in real time;
   after the activity of each real agent ends up, determining behavior information of the real agent by performing analysis of dynamic tracking information of the real agent.

4. The method according to claim 3, wherein, the behavior information comprises:
   action behaviors occurring during the activity and trigger conditions of various action behaviors.

5. The method according to claim 2, wherein,
   the attribute information comprises: class, length, width, height.

6. The method according to any one of claims 1, wherein, the method further comprises:
   performing playback of the simulated agent according to user-selected feature information;
   during playback, when a user's modification instruction for unreasonable feature information is received, modifying the information according to the modification instruction.

7. An apparatus for testing an unmanned vehicle in a simulated traffic scenario, the apparatus comprising:
   at least one processor; and
   a memory storing instructions, which when executed by the at least one processor, cause the at least one processor to perform operations, the operations comprising:
   for each agent class, respectively obtaining feature information of real agents belonging to the class and freely participating in traffic activities and in testing, the number of real agents belonging to each class being greater than one;
   simulating one or more agents of one or more classes;
   for each agent class, respectively extracting representative feature information from feature information obtained for each real agent belonging to the class, and taking the extracted representative feature information as feature information of simulated agents belonging to this class in the simulated traffic scenario for testing the unmanned vehicle, the representative information being feature information that are classified as universal among the agents;
   generating a real traffic scenario using the real agents participating in traffic activities and in testing, forming a scenario map;
   obtaining the simulated traffic scenario by superimposing the simulated agents in the scenario map; and
   testing the unmanned vehicle in the simulated traffic scenario and improving the correctness of testing the unmanned vehicle.

8. The apparatus according to claim 7, wherein, the real agents comprise real agents dedicated for testing;
   the feature information comprise attribute information and behavior information.

9. The apparatus according to claim 8, wherein,
   the operation of obtaining behavior information of each real agent respectively comprises:
   during an activity of each real agent, obtaining dynamic tracking information of the real agent in real time;
   after the activity of each real agent ends up, determining behavior information of the real agent by performing analysis of dynamic tracking information of the real agent.

10. The apparatus according to claim 9, wherein, the behavior information comprises:
    action behaviors occurring during the activity and trigger conditions of various action behaviors.

11. The apparatus according to claim 8, wherein,
    the attribute information comprises: class, length, width, height.

12. The apparatus according to claim 7, wherein,
    the operations further comprise:
    performing playback of the simulated agent according to the user-selected feature information;
    during playback, when a user's modification instruction for unreasonable feature information is received, modifying the information according to the modification instruction.

13. A non-transitory computer storage medium, wherein the computer storage medium is coded with a computer program, and when the program is executed by one or more computers, the one or more computers perform the following operations:
    for each agent class, respectively obtaining feature information of real agents belonging to the class and freely participating in traffic activities and in testing, the number of real agents belonging to each class being greater than one;
    simulating one or more agents of one or more classes;

for each agent class, respectively extracting representative feature information from feature information obtained for each real agent belonging to the class, and taking the extracted representative feature information as feature information of simulated agents belonging to this class in the simulated traffic scenario for testing a unmanned vehicle, the representative information being feature information that are classified as universal among the agents;

generating a real traffic scenario using the real agents participating in traffic activities and in testing, forming a scenario map;

obtaining the simulated traffic scenario by superimposing the simulated agents in the scenario map; and testing the unmanned vehicle in the simulated traffic scenario and improving the correctness of testing the unmanned vehicle.

\* \* \* \* \*